United States Patent
Makita et al.

[11] Patent Number: 6,013,544
[45] Date of Patent: Jan. 11, 2000

[54] METHOD FOR FABRICATING A SEMICONDUCTOR DEVICE

[75] Inventors: Naoki Makita, Nara; Tadayoshi Miyamoto; Tsukasa Shibuya, both of Tenri, all of Japan

[73] Assignee: Sharp Kabushiki Kaisha, Osaka, Japan

[21] Appl. No.: 08/610,227

[22] Filed: Mar. 4, 1996

[30] Foreign Application Priority Data

Mar. 13, 1995 [JP] Japan ................................... 7-053077

[51] Int. Cl.[7] .............................................. H01L 21/84
[52] U.S. Cl. ........................................ 438/166; 438/486
[58] Field of Search .................................. 438/162, 903, 438/166, 482, 486, 479

[56] References Cited

U.S. PATENT DOCUMENTS

| | | | |
|---|---|---|---|
| 5,403,772 | 4/1995 | Zhang et al. | 438/166 |
| 5,501,989 | 3/1996 | Takayama et al. | 435/168 |
| 5,543,352 | 8/1996 | Ohtani et al. | 438/166 |
| 5,550,070 | 8/1996 | Funai et al. | 438/166 |
| 5,569,610 | 10/1996 | Zhang et al. | 438/166 |
| 5,595,923 | 1/1997 | Zhang et al. | 438/166 |
| 5,605,846 | 2/1997 | Ohtani et al. | 438/166 |
| 5,614,426 | 3/1997 | Funada et al. | 438/166 |
| 5,624,851 | 4/1997 | Takayama et al. | 438/166 |
| 5,637,515 | 6/1997 | Takemura | 438/166 |
| 5,639,698 | 6/1997 | Yamazaki et al | 438/166 |
| 5,756,364 | 5/1998 | Tanaka et al. | 438/166 |
| 5,789,284 | 8/1998 | Yamazaki et al. | 438/166 |
| 5,837,569 | 11/1998 | Makita et al. | 438/166 |
| 5,869,389 | 2/1999 | Ding et al. | 438/486 |
| 5,923,968 | 7/1999 | Yamazaki et al. | 438/166 |
| 5,940,693 | 8/1999 | Maekawa | 438/166 |

FOREIGN PATENT DOCUMENTS

| | | |
|---|---|---|
| 6-244103 | 9/1994 | Japan . |
| 6-244104 | 9/1994 | Japan . |
| 96-12574 | 4/1996 | Rep. of Korea . |

*Primary Examiner*—Savitri Mulpuri
*Attorney, Agent, or Firm*—Nixon & Vanderhye P.C.

[57] ABSTRACT

A method for fabricating a semiconductor device including an active region obtained by utilizing a silicon semiconductor film having crystallinity which is formed on an insulating substrate is disclosed. A crystalline silicon semiconductor film is obtained by introducing catalyst elements for promoting the crystallization into a lower amorphous silicon semiconductor film and then performing a heat treatment onto the lower amorphous silicon semiconductor film. Thereafter, an upper amorphous silicon semiconductor film is formed on the obtained lower crystalline silicon semiconductor film, which is subsequently subjected to a heat treatment so as to obtain an upper crystalline silicon semiconductor film. Then, the upper crystalline silicon semiconductor film is removed. By this process, the catalyst elements remaining in the lower crystalline silicon semiconductor film moves into the upper crystalline silicon semiconductor film. As a result, a concentration of the catalyst elements in the lower crystalline silicon semiconductor film is reduced.

14 Claims, 4 Drawing Sheets

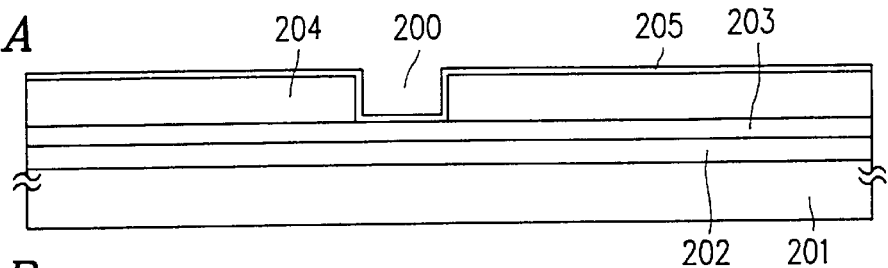
FIG. 4A
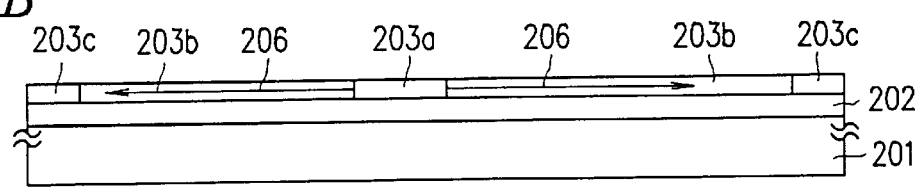
FIG. 4B
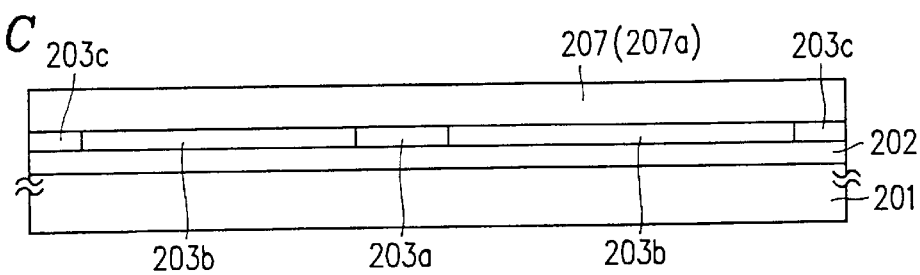
FIG. 4C
FIG. 4D
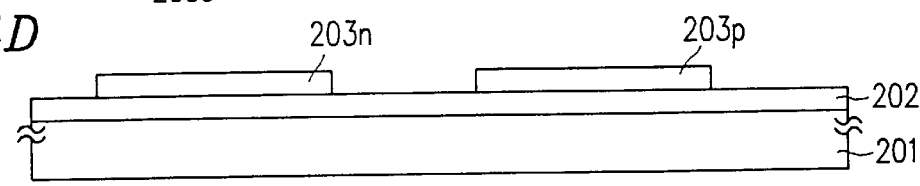
FIG. 4E
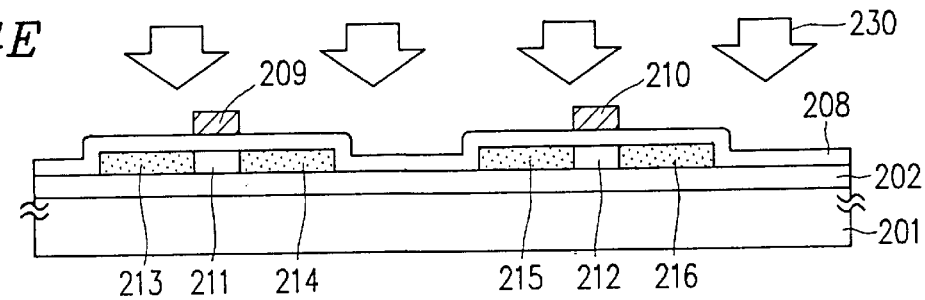
FIG. 4F
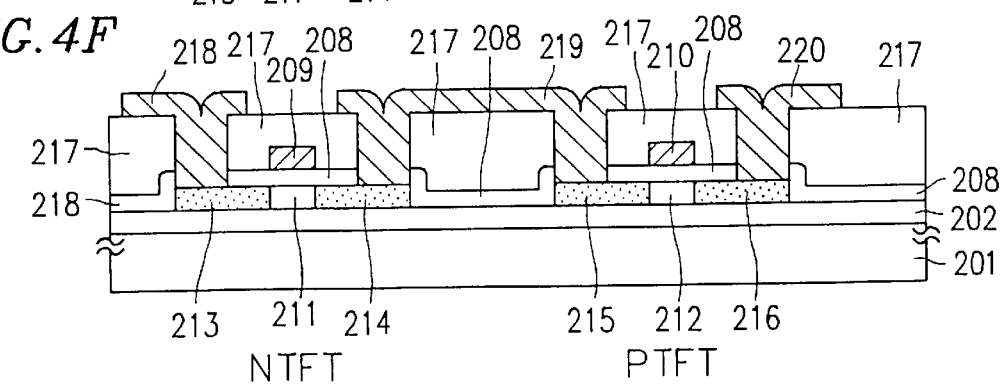

METHOD FOR FABRICATING A SEMICONDUCTOR DEVICE

BACKGROUND OF THE INVENTION

1. Field of the Invention

The present invention relates to a semiconductor device and a method for fabricating the same. In particular, the present invention relates to a semiconductor device using, as an active region, a crystalline silicon semiconductor film obtained by crystallizing an amorphous silicon semiconductor film formed on a substrate having an insulating surface, and to a method for fabricating the same. More specifically, the present invention is applicable to a semiconductor device using thin film transistors (TFTs) provided on an insulating substrate such as a glass substrate, an active matrix type liquid crystal display device, an image sensor, a three-dimensional IC and the like, and to the fabrication thereof.

2. Description of the Related Art

Recently, it has been attempted to form semiconductor devices having good performance on insulating substrates, made of materials such as glass, or on insulating films which are formed on a surface of a substrate, for realizing large liquid crystal display devices having a high resolution, close-contact type image sensors having a high resolution with high speed, or three-dimensional ICs and the like. Generally, the semiconductor devices used in these apparatuses are formed from silicon semiconductor thin films.

Such silicon semiconductor thin films are roughly classified into two types: amorphous silicon semiconductor films and crystalline silicon semiconductor films.

Of these two types, the amorphous silicon semiconductor film is preferred and enjoys general use because it has a low processing temperature and is easily manufactured using a vapor deposition method, thus lending itself to mass production. Compared to the crystalline silicon semiconductor film, however, the amorphous silicon semiconductor film is inferior in properties such as electrical conductivity. It is therefore strongly desired to establish an efficient fabrication method for semiconductor devices formed from crystalline silicon semiconductor films so as to achieve faster response characteristics of the semiconductor devices.

The crystalline silicon semiconductor films currently known include polycrystalline silicon, microcrystalline silicon, amorphous silicon containing crystalline components, semi-amorphous silicon having an intermediate state between crystalline and amorphous forms, etc. The following three methods are known for the production of these thin film crystalline silicon semiconductors.

(1) A first method in which a crystalline silicon semiconductor film is directly formed in a film deposition step.

(2) A second method in which an amorphous semiconductor film is first formed, followed by crystallization of the amorphous silicon semiconductor film using a laser's optical energy and the like.

(3) A third method in which an amorphous semiconductor film is first formed, followed by application of heat energy to crystallize the amorphous silicon semiconductor film.

However, these methods have the following disadvantages.

According to the first method, crystallization proceeds during the deposition step. Consequently, a thick silicon semiconductor film must be formed to obtain a crystalline silicon film with a large grain size. It is technically difficult, however, to form a film having good semiconductor properties uniformly over the entire surface of the substrate. Furthermore, the film needs to be deposited at high temperatures of 600° C. or more. This introduces disadvantages in cost in that inexpensive glass substrates cannot be used since they have low softening temperatures.

The second method utilizes crystallization in melting and solidification processes, and allows the formation of a high-quality crystalline silicon semiconductor film with a small grain size and yet having properly treated grain boundaries. However, with the lasers commonly used today, such as excimer lasers for example, processing throughput is low because the effective laser beam radiation area is small. A further disadvantage is that the stability of the lasers is not sufficient to uniformly process the entire surface of a large substrate.

The third method has an advantage over the first and second methods in that a thin-film crystalline silicon film can be formed uniformly over a large substrate. The method requires, however, heat treatment at high temperatures of 600° C. or more for several tens of hours to accomplish crystallization. Therefore, to allow the use of inexpensive glass substrates and to increase the processing throughput, contradicting requirements need to be satisfied simultaneously, i.e, to lower the processing temperature and to accomplish crystallization in a short period of time.

Methods for solving the aforementioned problems of a heat treatment utilizing method (3) above are disclosed in Japanese Laid-Open Patent Publication Nos. 6-244103 and 6-244104. These methods make it possible to reduce both the processing temperature and the time required for crystallization by utilizing catalyst elements for accelerating the crystallization of an amorphous silicon semiconductor film.

According to the proposed methods above, at least one of nickel, iron, cobalt and platinum is introduced into a surface of an amorphous silicon semiconductor film as a nucleus of crystal growth, which is then subjected to a heat treatment. Owing to the catalysts, crystallization is completed by a heat treatment at about 550° C. for about 4 hours. In consideration of the glass distortion temperature of the glass which is now commonly used as a glass substrate in an active-matrix type liquid crystal display device (for example, about 593° C. for Corning 7059 glass), the above method allowing a heating process to be conducted at such a low temperature is effective. In particular, since a glass substrate is inexpensive, the above method enabling the use of a glass substrate is greatly effective in view of enlargement of substrate area.

The mechanism for the above-described low-temperature crystallization is as follows. First, crystal nuclei with metal elements as their nuclei are generated in the early stage of the heating process. After that, the metal elements act as catalysts to accelerate the crystallization, and the crystal growth proceeds rapidly. In this sense, such metal elements are hereinafter referred to as the catalyst elements.

While the crystalline silicon semiconductor films obtained by crystallizing amorphous silicon semiconductor films using ordinary solid-phase growth methods have a twin crystal structure, the crystalline silicon semiconductor film obtained by accelerating the crystallization using catalyst elements as described above is formed from numerous column-like crystals. Moreover, an internal structure of each of the column-like crystals is in an ideal single crystalline state.

Furthermore, according to a method disclosed in the aforementioned Japanese Laid-Open Patent Publication No. 6-244104, the catalyst elements are selectively introduced into part of an amorphous silicon semiconductor film which is subsequently subjected to a heat treatment. As a result, crystalline silicon semiconductor films and amorphous silicon semiconductor films can be formed selectively in respectively designated regions on the same substrate. When the heat treatment is further continued, a phenomenon occurs where the crystallized regions laterally grow toward the surrounding amorphous regions from the regions in which the catalyst elements are selectively introduced, i.e., in directions parallel to the substrate surface. These crystallized regions grown in the lateral directions are hereinafter referred to as the lateral crystal growth regions.

While crystal nuclei are generated in a random manner in the region into which the catalyst elements are directly introduced, there exist column-like crystals extending substantially along one growth direction in the lateral crystal growth regions. Thus, the lateral crystal growth region has a remarkably excellent crystallinity as compared with the region into which the catalyst elements are introduced. By forming an active region of a semiconductor device utilizing the lateral crystal growth region, a semiconductor device with high performance, in particular with a high operation speed, can be realized.

The disadvantages associated with the conventional crystallization processes disclosed in the aforementioned Japanese Laid-Open Patent Publications will be discussed.

Although the introduced catalyst elements largely contribute to crystallization of an amorphous silicon semiconductor film, the catalyst elements are present at grain boundaries after the completion of crystallization. As a result, the catalyst elements remain in the obtained crystalline silicon semiconductor film. If a large amount of catalyst elements are present in the crystal-line silicon semiconductor films constituting active regions (device formation regions) of the semiconductor devices, the catalyst elements inhibit the realization of high reliability and stable electric characteristics of the semiconductor device. Thus, the presence of a large amount of catalyst elements is not preferable.

In particular, elements effectively acting as catalysts for accelerating the crystallization of an amorphous silicon semiconductor film, such as nickel, form an impurity level in the vicinity of the center of a band gap of the silicon. Therefore, undesirable phenomena such as increase in leak current in an OFF state, a shift of a threshold voltage and deterioration of operational characteristics with elapse of time may occur in view of the operational characteristics of a semiconductor device to be formed.

Therefore, although catalyst elements, such as nickel, for accelerating the crystallization of amorphous silicon are required in a crystallization process, it is desirable to make the amount of catalyst elements contained in the crystalline silicon semiconductor film to be obtained as small as possible. In order to attain this purpose, the amorphous silicon semiconductor film is conventionally crystallized while restricting the amount of catalyst elements to a minimum amount within the necessary range. However, since the amount of catalyst elements required for crystallization is significantly minute, i.e., about $10^{13}$ atoms/cm$^2$, it is remarkably difficult to restrict the amount of catalyst elements to be introduced to such an extremely low level.

In the case where the catalyst elements are introduced while controlling the amount of catalyst elements to a minute amount, it is difficult to make uniform the amount of catalyst elements to be introduced in the same substrate and/or to stably realize the introduction of a minute amount of catalyst elements between different substrates with good reproducibility. In the case where the amount of catalyst elements introduced into the same substrate or between a plurality of substrates is greatly non-uniform, defective regions are locally generated. In such defective regions, crystal growth does not occur due to a deficiency of catalyst elements, or characteristics of the obtained semiconductor device are adversely affected in a conspicuous manner due to excessive catalyst elements. Consequently, it is difficult to uniformly form a large number of semiconductor devices on the same substrate with the aforementioned conventional method, as an active matrix substrate of a liquid crystal display apparatus on which several hundreds of thousands of TFTs are formed.

In addition, even in the case where the catalyst elements are controlled to be introduced at a minute amount with high reproducibility, the catalyst elements are inevitably present in the device formation region (active region) at a concentration capable of causing crystallization or at a higher concentration. Therefore, it is impossible to completely eliminate the aforementioned adverse effects of the catalyst elements to the operational characteristics of the semiconductor device.

SUMMARY OF THE INVENTION

According to one aspect of the invention, a method for fabricating a semiconductor device including an active region obtained by utilizing a silicon semiconductor film having crystallinity is provided. The method includes the steps of introducing a catalyst element for accelerating crystallization of a lower amorphous silicon semiconductor film into a predetermined region which is at least part of the lower amorphous silicon semiconductor film, then performing a first heat treatment so as to crystallize the lower amorphous silicon semiconductor film to form a lower crystalline silicon semiconductor film including a column-like crystal, subsequently forming an upper amorphous silicon semiconductor film on the lower crystalline silicon semiconductor film, and then performing a second heat treatment so as to crystallize the upper amorphous silicon semiconductor film to form an upper crystalline silicon semiconductor film. A concentration of the catalyst element in the lower crystalline silicon semiconductor film is reduced by the second heat treatment so as to reform the lower crystalline silicon semiconductor film, the reformed lower crystalline silicon semiconductor film being used for forming the active region.

In one embodiment, the method further includes the step of removing the upper crystalline silicon semiconductor film.

In another embodiment, the catalyst element is selectively introduced into the predetermined region of the lower amorphous silicon semiconductor film so as to proceed crystallization of the lower amorphous silicon semiconductor film from the predetermined region toward a peripheral area thereof. Alternatively, the catalyst element is introduced into an entire surface of the lower amorphous silicon semiconductor film.

In still another embodiment, a temperature of the second heat treatment is set at a temperature equal to or higher than that of the first heat treatment.

In still another embodiment, a temperature of the second heat treatment is set in the range of about 520° C. to about 600° C.

In still another embodiment, the catalyst element is at least one element selected from a group substantially consisting of nickel, cobalt, palladium, platinum, copper, silver, gold, indium, tin, aluminum and antimony.

According to another aspect of the invention, a method for fabricating a semiconductor device including an active region obtained by utilizing a silicon semiconductor film having crystallinity is provided. The method includes the steps of: forming a first amorphous silicon semiconductor film on a substrate; introducing a catalyst element for accelerating crystallization of the first amorphous silicon semiconductor film into a predetermined region which is at least part of the first amorphous silicon semiconductor film; performing a first heat treatment so as to crystallize the first amorphous silicon semiconductor film to form a first crystalline silicon semiconductor film; forming a second amorphous silicon semiconductor film on the first crystalline silicon semiconductor film; performing a second heat treatment so as to crystallize the second amorphous silicon semiconductor film to form a second crystalline silicon semiconductor film and simultaneously so as to reduce a concentration of the catalyst element in the first crystalline silicon semiconductor film to reform the first crystalline silicon semiconductor film; and forming the active region utilizing the reformed first crystalline silicon semiconductor film.

In one embodiment, the method further includes the step of removing the second crystalline silicon semiconductor film.

In another embodiment, the catalyst element is selectively introduced into the predetermined region of the first amorphous silicon semiconductor film so as to proceed crystallization of the first amorphous silicon semiconductor film from the predetermined region toward a peripheral area thereof. Alternatively, the catalyst element is introduced into an entire surface of the first amorphous silicon semiconductor film.

In still another embodiment, a temperature of the second heat treatment is set at a temperature equal to or higher than that of the first heat treatment.

In still another embodiment, a temperature of the second heat treatment is set in the range of about 520° C. to about 600° C.

In still another embodiment, the catalyst element is at least one element selected from a group substantially consisting of nickel, cobalt, palladium, platinum, copper, silver, gold, indium, tin, aluminum and antimony.

According to still another aspect of the invention, a semiconductor device including an active region obtained by utilizing a crystalline silicon semiconductor film, wherein a concentration of a catalyst element for crystallization in the silicon semiconductor film is in a range of $1 \times 10^{14}$ atoms/cm$^3$ to $5 \times 10^{17}$ atoms/cm$^3$, is provided.

In one embodiment, the catalyst element is introduced so as to accelerate crystallization in a first heat treatment for obtaining the crystalline silicon semiconductor film, and a concentration of the catalyst element is reduced so as to be within said range by a subsequent second heat treatment.

In another embodiment, the catalyst element is at least one element selected from a group substantially consisting of nickel, cobalt, palladium, platinum, copper, silver, gold, indium, tin, aluminum and antimony.

Thus, the invention described herein makes possible the advantages of: (1) providing a semiconductor device with high performance having uniform and stable device characteristics in which only a small amount of current is leaked; and (2) providing a method for fabricating the same; and more specifically, (3) providing a fabricating method of a semiconductor device enabling the fabrication of a semiconductor device having uniform and stable high-performance operational characteristics with a reduced leak current in a simplified process having a high production yield by reducing a concentration of catalyst elements remaining in a crystalline silicon semiconductor film serving as an active region, wherein the device includes the device formation region (active region) obtained utilizing the crystalline silicon semiconductor film which is formed by a heat treatment at about 600° C. or lower utilizing the catalyst elements; and (4) providing a semiconductor device obtainable by such a fabrication method.

These and other advantages of the present invention will become apparent to those skilled in the art upon reading and understanding the following detailed description with reference to the accompanying figures.

BRIEF DESCRIPTION OF THE DRAWINGS

FIGS. 4A to 4F are cross-sectional views showing steps for fabricating the semiconductor device shown in FIG. 3 according to the second example of the present invention.

DESCRIPTION OF THE PREFERRED EMBODIMENTS

Figure 1:
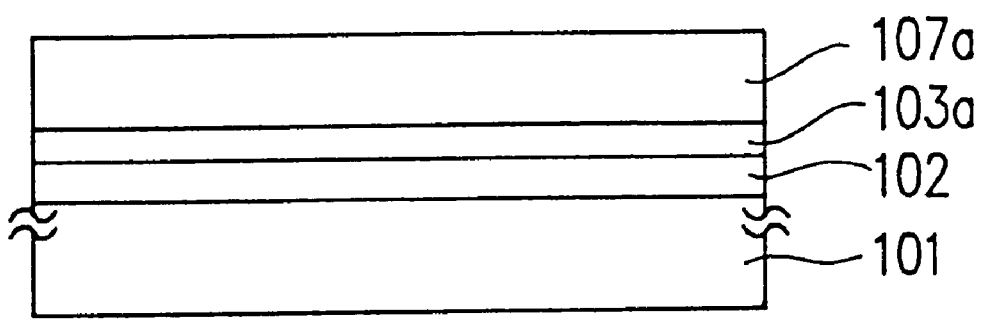
FIG. 1 is a cross-sectional view showing one step included in a fabrication method of a semiconductor device according to a first example of the present invention.

According to the present invention, catalyst elements for accelerating crystallization are introduced into an amorphous silicon semiconductor film (lower amorphous silicon semiconductor film, also referred to as a first amorphous silicon semiconductor film). Then, a heat treatment (first heat treatment) is performed onto the lower amorphous silicon semiconductor film so as to cause crystallization thereof, thereby obtaining a crystalline silicon semiconductor film (lower crystalline silicon semiconductor film, also referred to as a first crystalline silicon semiconductor film). Thereafter, another amorphous silicon semiconductor film (upper amorphous silicon semiconductor film, also referred to as a second amorphous silicon semiconductor film) is formed on the resultant lower crystalline silicon semiconductor film. Then, a heat treatment (second heat treatment) is performed so as to cause crystallization of the upper amorphous silicon semiconductor film, thereby obtaining another crystalline silicon semiconductor film (upper crystalline silicon semiconductor film, also referred to as a second crystalline silicon semiconductor film).

In the above fabrication process, catalyst elements remaining in the previously crystallized lower crystalline silicon semiconductor film, in particular at grain boundaries therein, move into the upper amorphous silicon semiconductor film during the crystallization thereof. Moreover, part of the catalyst elements further moves into the surface of the upper crystalline silicon semiconductor film which results from the crystallization. Thus, the remaining catalyst elements are removed from the lower crystalline silicon semiconductor film which is to be used as an active region of a semiconductor device in a subsequent step. Simultaneously, the grain boundaries in the lower crystalline silicon semiconductor film are locally recrystallized.

As a result, the lower crystalline silicon semiconductor film which is used as an active region possesses high quality as compared with that immediately after crystallization since a concentration of the catalyst elements in the film is lowered and the grain boundaries therein are well treated.

The mechanism of the above-described movement of the catalyst elements can be explained such that, in a ternary system of crystalline silicon semiconductor film/catalyst elements/amorphous silicon semiconductor film, differences in chemical potential and free energy at respective interfaces between the films act so as to allow the catalyst elements to move toward the amorphous silicon semiconductor film. During the crystallization of the upper amorphous silicon semiconductor film, which is accelerated by the catalyst elements contained in the lower crystalline silicon semiconductor film, the aforementioned ternary system of crystalline silicon semiconductor film/catalyst elements/amorphous silicon semiconductor film is realized.

More specifically, the crystal growth of the upper amorphous silicon semiconductor film proceeds from the interface with the lower crystalline silicon semiconductor film. After the catalyst elements for accelerating the crystallization contained in the lower crystalline silicon semiconductor film are rearranged at the interface, the catalyst elements aid the crystallization of the upper amorphous silicon semiconductor film while being present in the tip portion of crystal growth owing to the above mechanism. As a result, the crystal growth of the upper amorphous silicon semiconductor film proceeds from the interface with the lower crystalline silicon semiconductor film. Then, when the crystal growth is completed, the catalyst elements which are previously present in the tip portion of crystal growth are present at the surface of the resultant upper crystalline silicon semiconductor film.

In this way, the catalyst elements move to the surface of the upper crystalline silicon semiconductor film. Consequently, the catalyst elements remaining in the lower crystalline silicon semiconductor film serving as a device formation region (active region) are removed.

In the present invention, an important role is imposed on the setting of a temperature of the heat treatment (the second heat treatment) for crystallizing the upper amorphous silicon semiconductor film.

Specifically, in the case where the temperature of the second heat treatment is lower than a temperature required to crystallize the upper amorphous silicon semiconductor film, the catalyst elements are solely thermally diffused in the upper amorphous silicon semiconductor film. A concentration of the catalyst elements in the lower crystalline silicon semiconductor film is reduced to a certain degree owing to the thermal diffusion. In order to obtain satisfactory effects, however, it is desirable to set the temperature of the second heat treatment to a temperature equal to or higher than the temperature for crystallizing the upper amorphous silicon semiconductor film so as to certainly cause the crystallization thereof. When the temperature is set in such a manner, the catalyst elements effectively move in the upper amorphous silicon semiconductor film in accordance with the movement mechanism in the ternary system described above, so that the concentration of the catalyst elements remaining in the lower crystalline silicon semiconductor film serving as the active region (the device formation region) is greatly reduced.

Furthermore, the catalyst elements in the lower crystalline silicon semiconductor film are at first present at grain boundaries. The catalyst elements then move in the upper amorphous silicon semiconductor film when the aforementioned heat treatment is conducted, thereby recrystallizing the grain boundaries. As a result, the grain boundaries are well treated.

As a result of the above recited process, the lower crystalline silicon semiconductor film is reformed to be a crystalline silicon semiconductor film which has a high quality and a small density of trap levels with respect to carriers. By using the thus reformed crystalline silicon semiconductor film as an active region (device formation region), it becomes possible to fabricate a semiconductor device having high performance device characteristics such as a high mobility.

In particular, setting the temperature of the second heat treatment to a temperature higher than that required to crystallize the upper amorphous silicon semiconductor film means that the temperature of the second heat treatment is set to a temperature higher than that required to crystallize the lower amorphous silicon semiconductor film (i.e., the temperature of the first heat treatment). According to such selection of the temperature, the catalyst elements, which remain and are trapped in the lower crystalline silicon semiconductor film, receive a thermal energy greater than that given when the catalyst elements were left in the lower crystalline silicon semiconductor film (in other words, a thermal energy applied during the first heat treatment for crystallizing the lower amorphous silicon semiconductor film). As a result, it is possible to certainly cause the remaining catalyst elements to move into the upper amorphous silicon semiconductor film so as to surely and effectively remove the catalyst elements from the lower crystalline silicon semiconductor film serving as an active region (device formation region). Simultaneously, the grain boundaries of the lower crystalline silicon semiconductor film are effectively recrystallized to be well treated.

A temperature of the second heat treatment for the upper amorphous silicon semiconductor film is typically set within the range of about 520° C. to about 600° C. Preferably, it is set within the range of about 570° C. to about 600° C. The temperature is set within the above range for the following reasons.

In order to effectively crystallize the upper amorphous silicon semiconductor film using the remaining catalyst elements in the lower crystalline silicon semiconductor film serving as the device formation region (active region), it is necessary to heat the upper amorphous silicon semiconductor film at about 520° C. or higher. Furthermore, in order to move the remaining catalyst elements which are trapped in the lower crystalline silicon semiconductor film, it is desirable to set the heat treatment temperature at about 570° C. or higher.

A typical glass substrate capable of being used in the fabrication of the semiconductor device according to the present invention has a distortion point in the vicinity of about 600° C. For example, a glass distortion point of Corning 7059 glass, which can be used as a glass substrate in the present invention, is about 593° C. Accordingly, in consideration of the heat resistance of the glass substrate which can be generally used now, it is desirable to set the temperature of a second heat treatment to about 600° C. or lower.

In the case where a glass substrate having a further improved heat resistance is available, it is possible to set a temperature of the second heat treatment to a higher temperature. Nevertheless, even when the temperature of the second heat treatment is set to much higher than 600° C., it is not expected that the resultant effects are further improved.

A concentration of the catalyst elements in the lower crystalline silicon semiconductor film obtained by the present invention is typically in the range of about $1 \times 10^{14}$ atoms/cm$^3$ to about $5 \times 10^{17}$ atoms/cm$^3$. On the other hand, in the case where a conventional method is employed, for example, where the crystal growth is caused over the entire amorphous silicon semiconductor film, that is, the entire surface growth is conducted, a concentration of the catalyst elements remaining in the resultant crystalline silicon semiconductor film is about $1\times10^{18}$ atoms/cm$^3$. Therefore, according to the present invention, a concentration of the catalyst elements remaining in the crystalline silicon semiconductor film to be used as an active region (device formation region) of the semiconductor device is reduced by about one digit or more. The inventors of the present invention confirmed that, when the concentration of the catalyst elements remaining in the crystalline silicon semiconductor film is reduced to such a degree, the operational characteristics of the semiconductor device are hardly affected.

As the catalyst elements for obtaining the crystalline silicon semiconductor film, nickel produces the most remarkable intended effect. Besides nickel, Co, Pd, Pt, Cu, Ag, Au, In, Sn, Al, Sb and the like can be utilized. By using a kind of or plural kinds of elements selected from these elements as catalyst elements, an effect of accelerating the crystallization can be obtained.

As described above, the present invention relates to a method for fabricating a thin film crystalline silicon semiconductor film by a heat treatment at about 600° C. or lower utilizing catalyst elements. By reducing a concentration of the catalyst elements remaining in the device formation region (active region), a crystalline silicon semiconductor film with high quality is obtained. As a result, a semiconductor device having uniform and stable high-performance operational characteristics with a reduced leak current can be fabricated.

Hereinafter, examples of the present invention will be described with reference to the accompanying drawings.

EXAMPLE 1

With reference to FIG. 1 and FIGS. 2A through 2E, a semiconductor device and a fabrication method thereof according to Example 1 of the present invention will now be described. Specifically, an n-type thin film transistor (TFT) is fabricated in Example 1.

FIG. 1 is a cross-sectional view showing one step included in a method for fabricating a semiconductor device (n-type TFT) according to Example 1. FIGS. 2A through 2E are cross-sectional views showing a series of fabrication steps. More specifically, FIG. 1 shows the step between the steps shown in FIGS. 2B and 2C.

In order to fabricate a semiconductor device having an n-type TFT 100 according to Example 1, a base coat film 102, made of silicon oxide, is formed on a glass substrate 101 so as to prevent diffusion of impurities from the glass substrate 101. On the base coat film 102, a crystalline silicon semiconductor film (hereinafter, also referred to as "lower crystalline silicon semiconductor film" or "first crystalline silicon semiconductor film) 103*a* is formed by being subject to the introduction of catalyst elements and the subsequent heat treatment. On the lower crystalline silicon semiconductor film 103*a*, another crystalline silicon semiconductor film (hereinafter, also referred to as "upper crystalline silicon semiconductor film" or "second crystalline silicon semiconductor film") 107*a* which is crystallized by a heat treatment is provided. By this configuration, a concentration of the catalyst elements in the lower crystalline silicon semiconductor film 103*a* is lowered so as to enhance the quality of the semiconductor device to be formed. In order to complete the fabricating process, the semiconductor device is formed utilizing the lower crystalline silicon semiconductor film 103*a* as an active region after removing the upper crystalline silicon semiconductor film 107*a*.

In the above description, the lower crystalline silicon semiconductor film 103*a* is formed by introducing catalyst elements for accelerating the crystallization such as nickel into an amorphous silicon semiconductor film (hereinafter, also referred to as "lower amorphous silicon semiconductor film" or "first amorphous silicon semiconductor film") and subsequently performing a heat treatment (first heat treatment). Crystal grains in the resultant lower crystalline silicon semiconductor film 103*a* are formed from a plurality of column-like crystals in a substantial single crystalline state. Furthermore, the upper crystalline silicon semiconductor film 107*a* is obtained by providing another amorphous silicon semiconductor film (hereinafter, also referred to as "upper amorphous silicon semiconductor film or "second amorphous silicon semiconductor film") on the lower crystalline silicon semiconductor film 103*a* and subsequently performing a heat treatment (second heat treatment) so as to crystallize the upper amorphous silicon semiconductor film.

The upper amorphous silicon semiconductor film, which serves as a basis of the upper crystalline silicon semiconductor film 107*a*, is crystallized in a direction moving from a boundary with the lower crystalline silicon semiconductor film 103*a* toward the surface of the upper amorphous silicon semiconductor film, utilizing the catalyst elements remaining in the lower crystalline silicon semiconductor film 103*a*. In this process of crystallization, the catalyst elements remaining in the lower crystalline silicon semiconductor film 103*a* move into the upper amorphous silicon semiconductor film formed thereon, and further become present in the surface of the upper crystalline silicon semiconductor film 107*a* obtained by the crystallization process. On the other hand, at the same time, the grain boundaries in the lower crystalline silicon semiconductor film 103*a* are recrystallized to be well treated. As a result, the amount of catalyst elements remaining in the lower crystalline silicon semiconductor film 103*a* is reduced. Thus, the quality of the lower crystalline silicon semiconductor film 103*a* to be used as an active region (device formation region) of the semiconductor device is enhanced. Consequently, the semiconductor device which is formed by using the lower crystalline silicon semiconductor film 103*a* possesses good device characteristics.

In the following description, described is the case where an n-type TFT 100 is formed by way of example, in which the lower crystalline silicon semiconductor film 103*a* is utilized as an active region of the n-type TFT 100. The n-type TFT 100 to be formed can be used as a constituent element of a driver part or a pixel part of an active matrix type liquid crystal display device, and also as a constituent element of a CPU formed on the same substrate. Furthermore, the n-type TFT 100 to be formed can be utilized not only for a liquid crystal display device but also a common thin film integrated circuit.

Next, a method for fabricating the n-type TFT 100 will be described with reference to FIGS. 2A to 2E.

Figure 2A:
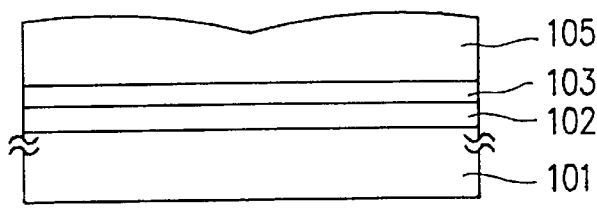
FIGS. 2A to 2E are cross-sectional views showing steps for fabricating the semiconductor device according to the first example of the present invention.

First, as shown in FIG. 2A, a base coat film 102 which is made of silicon dioxide and has a thickness of approximately 200 nm is deposited by using a sputtering apparatus onto a substrate 101 having an insulating surface, for example, a glass substrate, for preventing impurities from diffusing from the substrate 101. Next, by low-pressure CVD or plasma CVD, an intrinsic (I-type) amorphous silicon semiconductor film (lower amorphous silicon semiconductor film) 103 is deposited to a thickness of about 25 nm to about 100 nm, for example, to about 80 nm.

Next, the substrate 101 is held so that a solution 105 in which nickel is dissolved is in contact with the thus formed amorphous silicon semiconductor film 103. While using, for example, nickel acetate as a solute of the solution 105, a nickel concentration in the solution 105 is set to about 100 ppm. After the nickel solution 105 is caused to be in contact with the amorphous silicon semiconductor film 103, the solution 105 is uniformly applied onto the glass substrate 101 by a spinner and subsequently is dried (see FIG. 2A).

Then, the entire substrate 101, on which the base coat film 102 and the amorphous silicon semiconductor film 103 are successively formed and the nickel solution 105 is applied, is annealed at a heating temperature in the range of about 520° C. to about 580° C. for several hours to several tens of hours, for example, at about 550° C. for about four hours. By this annealing process, the entire amorphous silicon semiconductor film 103 is crystallized.

Figure 2B:
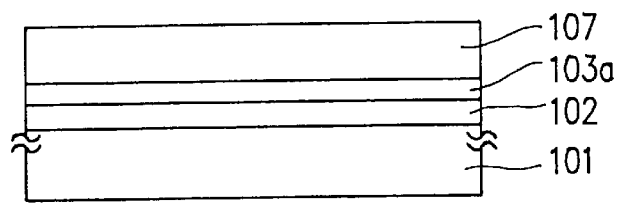

Specifically, nickel contained in the nickel solution 105 applied onto the surface of the amorphous silicon semiconductor film 103 acts as a nucleus of crystallization. Thus, the amorphous silicon semiconductor film 103 is crystallized in a direction vertical to the glass substrate 101. As a result, as shown in FIG. 2B, the crystalline silicon semiconductor film (lower crystalline silicon semiconductor film) 103a is formed.

Nickel applied onto the surface of the amorphous silicon semiconductor film 103 diffuses approximately throughout the intended crystalline silicon semiconductor film 103a. A nickel concentration in the crystalline silicon semiconductor film 103a is typically at about $2\times10^{18}$ atoms/cm$^3$.

Next, another amorphous silicon semiconductor film (upper amorphous silicon semiconductor film) 107 is deposited by low pressure CVD or plasma CVD so as to cover the crystalline silicon semiconductor film 103a. The thickness of the amorphous silicon semiconductor film 107 is preferably set in the range of about 50 nm to about 200 nm, for example, set to about 100 nm.

Thereafter, an annealing treatment is performed in an inert gas atmosphere such as a nitrogen atmosphere at a temperature in the range of about 520° C. to about 600° C. for several hours to several tens of hours, for example at about 580° C. for about four hours. Owing to this annealing treatment, the amorphous silicon semiconductor film 107 is vertically crystallized in a direction from the interface between the crystalline silicon semiconductor film 103a and the amorphous silicon semiconductor film 107 toward the surface of the amorphous silicon semiconductor film 107, utilizing nickel remaining in the crystalline silicon semiconductor film 103a, in particular at the grain boundaries therein. As a result, as previously described with reference to FIG. 1, the crystalline silicon semiconductor film (upper crystalline silicon semiconductor film) 107a is formed on the lower crystalline silicon semiconductor film 103a.

During this crystallization process, nickel moves from the crystalline silicon semiconductor film 103a toward the amorphous silicon semiconductor film 107 to be partially present on the surface of the formed crystalline silicon semiconductor film 107a. As a result, nickel in the crystalline silicon semiconductor film 103a is removed, and further the grain boundaries of the crystalline silicon semiconductor film 103a are recrystallized to be well treated.

Then, the thus obtained crystalline silicon semiconductor film 107a is removed by etching. By this etching, nickel moving from the crystalline silicon semiconductor film 103a to the crystalline silicon semiconductor film 107a is also removed. With the aforementioned processes, a concentration of the catalyst elements (nickel) remaining in the crystalline silicon semiconductor film 103a is reduced to about $1\times10^{17}$ atoms/cm$^3$. Therefore, a crystalline silicon semiconductor film 103a with high quality is obtained.

Figure 2C:
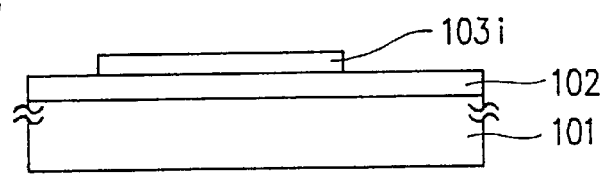

Next, the crystalline silicon semiconductor film 103a is patterned so as to remove the unnecessary part, thereby separating devices from each other. By this patterning, an island region 103i made of the crystalline silicon semiconductor film serving as an active region (source/drain region and channel region) of the n-type TFT 100 to be formed in the subsequent step, that is, a device formation region, is formed as shown in FIG. 2C.

Figure 2D:
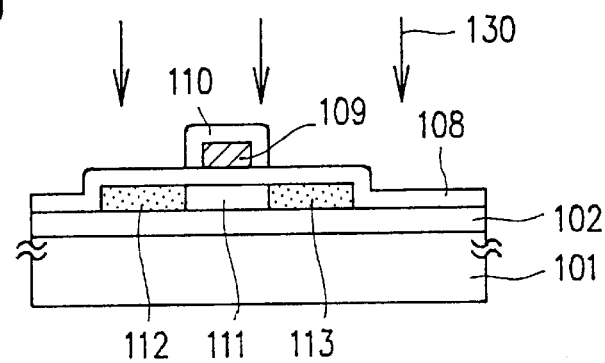

Next, as shown in FIG. 2D, a silicon oxide film having a thickness in the range of about 20 nm to about 150 nm, for example, about 100 nm covering the island region 103i of the crystalline silicon semiconductor film is deposited as a gate insulating film 108. The gate insulating film (silicon oxide film) 108 is formed by decomposing and depositing TEOS (Tetra Ethoxy Ortho Silicate) and oxygen by RF plasma CVD while setting a substrate temperature in the range of about 150° C. to about 600° C., preferably, in the range of about 300° C. to about 400° C. Alternatively, the gate insulating film 108 is formed by decomposing and depositing TEOS and an ozone gas by low pressure CVD or normal pressure CVD while setting a substrate temperature in the range of about 350° C. to about 600° C., preferably, in the range of about 400° C. to about 550° C.

Next, in order to improve bulk characteristics of the gate insulating film 108 itself and interface characteristics between the crystalline silicon semiconductor film 103i and the gate insulating film 108, annealing is performed in an inert gas atmosphere at a temperature in the range of about 400° C. to about 600° C. for about 30 minutes to about 60 minutes.

Thereafter, by sputtering, an aluminum film having a thickness in the range of about 400 nm to about 800 nm, for example, about 600 nm, is deposited onto the gate insulating film 108. The aluminum film is then patterned so as to form a gate electrode 109 as shown in FIG. 2D.

Next, the gate electrode 109 is anodized so as to form an oxide layer 110 thereon (see FIG. 2D). The anodizing is carried out by immersing the substrate into, for example, an ethylene glycol solution containing tartaric acid at 1% to 5%, raising an applied voltage to 220 V while keeping a current constant and holding the substrate in such a state for an hour. A thickness of the obtained oxide layer 110 is typically about 200 nm. The oxide layer 110 is used for forming an offset gate region in an ion doping process described below. Thus, by properly controlling parameters of the above anodizing process to control the thickness of the oxide layer 110, it is possible to determine a length of the offset gate region.

Subsequently, the active region 103i is doped with phosphorus acting as an n-type impurity by ion doping, utilizing the gate electrode 109 and the oxide layer 110 formed thereon as a mask. Specifically, in this case, phosphine (PH$_3$) is used as a doping gas. An accelerating voltage is set in the range of about 60 kV to about 90 kV, for example, about 80 kV, and a dose is set in the range of about $1\times10^{15}$ cm$^{-2}$ to about $8\times10^{15}$ cm$^{-2}$, for example, about $2\times10^{15}$ cm$^{-2}$. The regions 112 and 113, which are doped with the impurities by the ion doping process, are later to be source/drain regions of the n-type TFT 100. A region 111 which is masked with the gate electrode 109 and the oxide layer 110 so as not to be doped with the impurities is later to be a channel region of the n-type TFT 100.

Next, as shown in FIG. 2D, annealing is performed by radiating laser beams 130 so as to activate the doped impurities and, at the same time, to improve the crystallinity of the portion where crystallinity has been deteriorated by the above ion doping process. For example, an XeCl excimer laser (wavelength: about 308 nm, pulse width: about 40 ns) can be used, and the laser beams are radiated with an energy density of about 150 mJ/cm$^2$ to about 400 mJ/cm$^2$, preferably, about 200 mJ/cm$^2$ to about 250 mJ/cm$^2$. After the irradiation with the laser beams 130, a sheet resistance of the regions 112 and 113, which are doped with phosphorus acting as an n-type impurity, is typically in the range of about 200 Ω/□ to about 800 Ω/□.

Figure 2E:
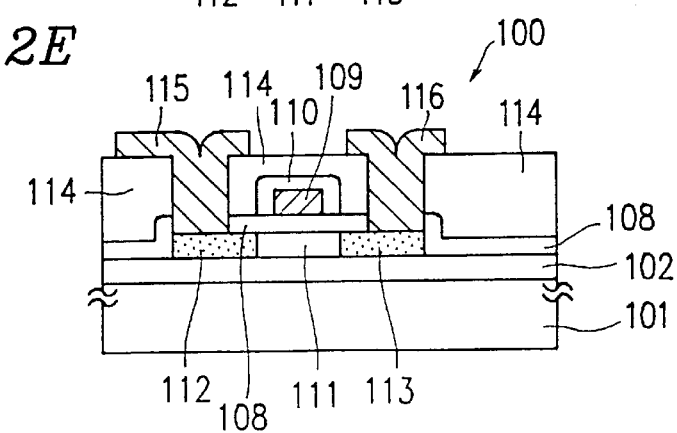

Next, as shown in FIG. 2E, a silicon oxide film or a silicon nitride film having a thickness of about 600 nm is deposited as an interlayer insulating film 114. In the case where a silicon oxide film is used, TEOS and oxygen are decomposed and deposited by plasma CVD. Alternatively, TEOS and ozone are decomposed and deposited by low pressure CVD or normal pressure CVD. With this process, an excellent interlayer insulating film 114, which can sufficiently cover the difference in levels of the surface of the substrate, is deposited as shown in FIG. 2E. Alternatively, when the interlayer insulating film 114 is formed using a silicon nitride film deposited by plasma CVD using SiH$_4$ and NH$_3$ as material gases, it is possible to supply hydrogen atoms to the interface between the crystalline silicon semiconductor film (active region) 103i and the gate insulating film 108. This has the effect of reducing unpaired bonds present in the crystalline silicon semiconductor film 103i, thus realizing an improvement of TFT characteristics.

Furthermore, contact holes are formed through the interlayer insulating film 114 as shown in FIG. 2E. Electrodes/wirings 115 and 116 of the n-type TFT 100 are formed of metal materials, for example, of multi-layered films of titanium nitride and aluminum, and are connected to the source/drain regions 112 and 113. The titanium nitride film functions as a barrier layer for preventing aluminum from diffusing into the crystalline silicon layer 103i.

As the final step, then, annealing is performed in a hydrogen atmosphere of about 1 atm at about 350° C. for about 30 minutes, thereby completing an n-type TFT 100.

The thus fabricated n-type TFT 100 of Example 1 can be used in a peripheral driver circuitry or a switching element in a pixel region of an active matrix type liquid crystal display apparatus, as well as in a thin film integrated circuit in which a CPU is constituted. In the case where the n-type TFT 100 of Example 1 is used as an element for switching a pixel electrode, one of the electrodes/wirings 115 and 116 is connected to a pixel electrode (not shown) formed from a transparent conductive film such as ITO, and a signal is inputted from the other one of the electrode/wiring 115 and 116. In the case where the n-type TFT 100 of Example 1 is used in a thin film integrated circuit such as a CPU, another contact hole is formed on the gate electrode 109, and a necessary wiring to be connected to the gate electrode 109 is formed.

The thus fabricated n-type TFT 100 of Example 1 exhibits good characteristics such as field-effect mobility in the range of about 70 cm$^2$/Vs to about 90 cm$^2$/Vs and threshold voltage in the range of about 2 V to about 3 V. A leak current in an OFF state of the TFT is small, that is, about several pA. Even in the case where the aforementioned characteristics are repeatedly measured, the results of measurement hardly change with the elapse of time. Thus, extremely stable transistor characteristics are obtained.

EXAMPLE 2

Hereinafter, with reference to FIG. 3 and FIGS. 4A through 4F, Example 2 of the present invention will be described. Hereinafter, the case where a circuit having a CMOS structure including an n-type TFT and a p-type TFT constituted in a complementary form on a glass substrate, which is used in a peripheral driver circuitry of an active-matrix type liquid crystal display device and a general thin film integrated circuit, is described by way of example.

Figure 3:
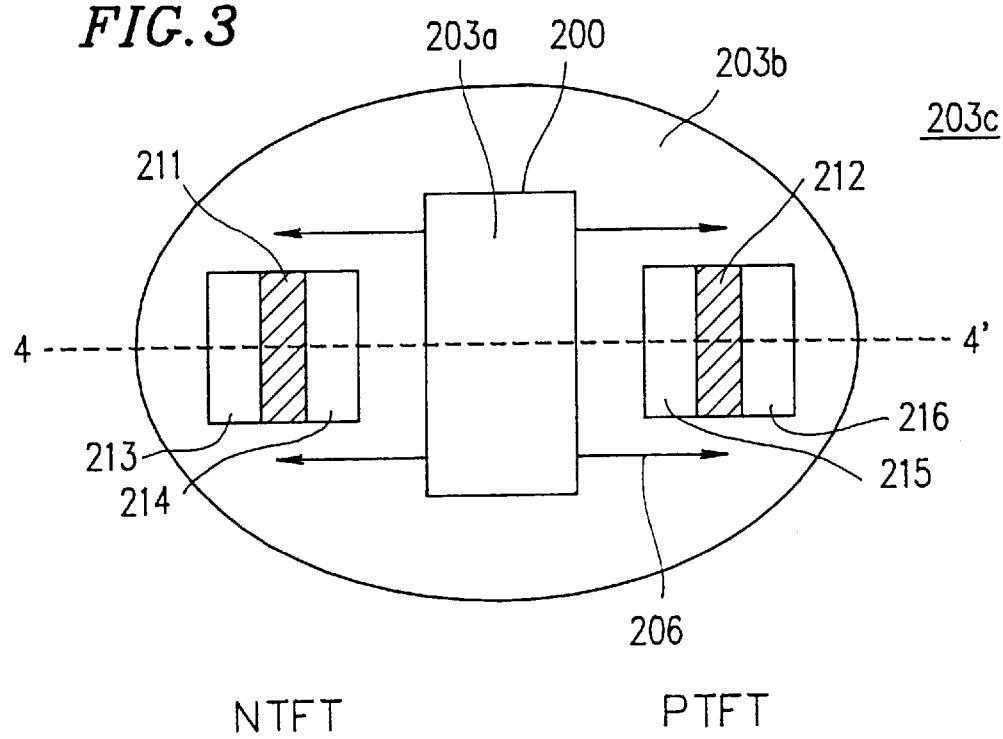
FIG. 3 is a plan view showing a semiconductor device according to a second example of the present invention.

FIG. 3 is a cross-sectional view showing a semiconductor device having a CMOS structure formed in accordance with Example 2. FIGS. 4A through 4F are cross-sectional views showing fabrication steps of the semiconductor device having the CMOS structure shown in FIG. 3.

First, as shown in FIG. 4A, a base coat film 202 made of silicon oxide having a thickness of about 100 nm is deposited on a glass substrate 201 by, for example, sputtering. Next, by low-pressure CVD, an intrinsic (I-type) amorphous silicon semiconductor film (lower amorphous silicon semiconductor film) 203 is deposited to a thickness of about 25 nm to about 100 nm, for example, to about 50 nm.

Next, a photosensitive resin (photo resist) is applied onto the amorphous silicon semiconductor film 203, and subsequently is exposed to light to form a photo resist mask 204. Furthermore, a predetermined region 200 of the mask 204 is selectively removed to form a slit-like opening 200.

FIG. 3 is a plane view showing the upper surface of the amorphous silicon semiconductor film 203 through which the opening 200 is formed, which is viewed from the upside. A region of the amorphous silicon semiconductor film corresponding to the opening 200 is exposed while the other region is covered with the mask.

After forming the mask 204, a nickel thin film 205 is formed by vapor deposition as shown in FIG. 4A. The nickel thin film 205 in the region 200 is adhered to the surface of the amorphous silicon semiconductor film 203 exposed on the bottom and the side faces of the mask 204, while the nickel thin film 205 is deposited onto the mask 204 in the other region.

In Example 2, by making a distance between a vapor deposition source and a substrate greater than a usual value so as to reduce a deposition rate as compared with a usual rate, the nickel thin film 205 is made extremely thin so as to have a thickness in the range of about 1 nm to about 2 nm. A surface density of nickel on the glass substrate 201 is preferably in the range of about $5 \times 10^{10}$ atoms/cm$^2$ to about $5 \times 10^{13}$ atoms/cm$^2$. As specific treatment conditions, for example, deposition is conducted for about 5 seconds, with a degree of vacuum during deposition set to about $1 \times 10^{-4}$ Pa and a distance between the deposition source and the substrate set to about 60 cm. In this case, the obtained surface density of nickel is about $4 \times 10^{13}$ atoms/cm$^2$.

As described above, the deposited nickel film 205 is in contact with the amorphous silicon semiconductor film 203 in the opening 200. By removing the mask 204 by etching, the nickel thin film 205 on the surface of the mask 204 is lifted off together. As a result, a minute amount of nickel is introduced into the region of the amorphous silicon semiconductor film 203 corresponding to the opening 200.

Thereafter, the substrate 201, on which the above layers are successively deposited, is subjected to a heat treatment at about 520° C. to about 580° C. for several to several tens of hours in an inert gas atmosphere such as a nitrogen gas atmosphere so as to crystallize the amorphous silicon semiconductor film 203. Specifically, the heat treatment is conducted, for example, at about 550° C. for about 16 hours. With this heat treatment, the region 200 of the amorphous silicon semiconductor film 203, into which a minute amount of nickel has been selectively introduced, is first crystallized in a direction perpendicular to the substrate 201, thereby forming a crystalline silicon semiconductor film 203a. Furthermore, in the periphery of the crystalline silicon semiconductor film 203a corresponding to the opening 200, the crystal growth proceeds in a direction substantially parallel to the surface of the substrate 201 as indicated with arrows 206 in FIG. 4B so as to form the laterally grown crystalline silicon semiconductor film 203b. In the region surrounding the laterally grown crystalline silicon semiconductor film 203b, a silicon semiconductor film 203c which is still in an amorphous state remains.

A nickel concentration in the crystalline silicon substrate film 203b which is laterally grown is typically about $1 \times 10^{17}$ atoms/cm$^3$. The lateral crystal growth range indicated with the arrows 206 is typically about 80 μm.

Next, as shown in FIG. 4C, another amorphous silicon semiconductor film (upper amorphous silicon semiconductor film) 207 is deposited by low pressure CVD or plasma CVD so as to totally cover the crystalline silicon semiconductor films 203a and 203b and the amorphous silicon semiconductor film 203c. A thickness of the upper amorphous silicon semiconductor film 207 is preferably in the range of about 50 nm to about 200 nm, for example, about 150 nm.

Thereafter, an annealing treatment is performed at a heating temperature in the range of about 520° C. to about 600° C. for several hours to several tens of hours, for example, at about 600° C. for about four hours. By this annealing treatment, the upper amorphous silicon semiconductor film 207 is vertically crystallized in a direction from the interface with the crystalline/amorphous silicon semiconductor films 203a, 203b and 207 toward the surface of the amorphous silicon semiconductor film 207 utilizing nickel in the crystalline silicon semiconductor films 203a and 203b, in particular at grain boundaries therein, as the catalyst elements for crystallization. As a result, the upper crystalline silicon semiconductor film 207a is formed.

During the crystallization process, nickel moves from the crystalline silicon semiconductor films 203a and 203b toward the amorphous silicon semiconductor film 207. Part of nickel become present on the surface of the resultant crystalline silicon semiconductor film 207a. As a result, nickel which previously remained in the crystalline silicon semiconductor films 203a and 203b is removed while the grain boundaries of the crystalline silicon semiconductor films 203a and 203b are recrystallized and well treated.

Thereafter, the crystallized upper silicon semiconductor film 207a is removed by etching. By this etching, nickel previously serving as the catalyst element which moves from the lower crystalline silicon semiconductor films 203a and 203b in the upper crystalline silicon semiconductor film 207a is simultaneously removed. By the above steps, the catalyst element (nickel) concentration in the crystalline silicon semiconductor films 203a and 203b is reduced to about $1 \times 10^{16}$ atoms/cm$^3$. Thus, a crystalline silicon semiconductor film with high quality is obtained.

Next, XeCl excimer laser beams (wavelength: about 308 nm, pulse width: about 40 ns) are radiated in order to improve the crystallinity of the crystalline silicon semiconductor film 203b. The radiation conditions of the laser beams are typically set as follows. A substrate temperature during irradiation is in the range of about 150° C. to about 450° C., for example, about 300° C. An energy density of the laser light is in the range of about 200 mJ/cm$^2$ to about 350 mJ/cm$^2$, for example, about 250 mJ/cm$^2$.

Next, the crystalline silicon semiconductor film 203b is patterned so as to remove an unnecessary part, thereby separating devices from each other. By this patterning, island regions 203n and 203p made of the crystalline silicon semiconductor film serving as an active region (source/drain region and channel region) of TFTs to be formed in the subsequent step, that is, device formation regions, are formed as shown in FIG. 4D. The region 203n and the region 203p are used for forming an n-type TFT and a p-type TFT, respectively.

Next, as shown in FIG. 4E, a silicon oxide film having a thickness of about 100 nm which covers the island regions 203n and 203p of the crystalline silicon semiconductor film is deposited as a gate insulating film 208. In Example 2, the gate insulating film (silicon oxide film) 208 is formed by decomposing and depositing TEOS and oxygen by RF plasma CVD while setting a substrate temperature at about 350° C.

Thereafter, by sputtering an aluminum film (containing silicon at about 0.1% to about 2%) having a thickness in the range of about 400 nm to about 800 nm, for example, about 500 nm, is deposited onto the gate insulating film 208. The aluminum film is then patterned so as to form gate electrodes 209 and 210 as shown in FIG. 4E.

An anodized oxide film may be thereafter formed on the gate electrodes 209 and 210 as described in Example 1.

Subsequently, the device formation regions 203n and 203p are doped with phosphorus acting as an n-type impurity and boron serving as a p-type impurity, respectively, by ion doping, using the gate electrodes 209 and 210 as masks. Specifically, ion doping of phosphorus is conducted using phosphine (PH$_3$) as a doping gas while setting an accelerating voltage in the range of about 60 kV to about 90 kV for example, about 80 kV, and a dose is in the range of about $1 \times 10^{15}$ cm$^{-2}$ to about $8 \times 10^{15}$ cm$^{-2}$, for example, about $2 \times 10^{15}$ cm$^{-2}$. On the other hand, ion doping of boron is conducted using diborane (B$_2$H$_6$) as a doping gas while setting an accelerating voltage in the range of about 40 to about 80 kV, for example, about 65 kV and a dose in the range of about $1 \times 10^{15}$ cm$^{-2}$ to about $8 \times 10^{15}$ cm$^{-2}$, for example, about $5 \times 10^{15}$ cm$^{-2}$.

By this ion doping process, regions 213 to 216 doped with the impurities are obtained to be source/drain regions of TFTs. Regions 211 and 212, which are masked with the gate electrodes 209 and 210 so as not to be doped with the impurities, are also obtained to be channel regions of TFTs in the subsequent process. When the doping of the n-type and p-type impurity elements is conducted, the region which is not required to be doped with impurity elements of the respective types are covered with properly patterned photo resists, thereby selectively doping the predetermined regions with the n-type and p-type impurity elements, respectively. Thus, the n-type impurity regions 213 and 214 and the p-type impurity regions 215 and 216 are selectively formed. By using these regions, an n-type TFT and a p-type TFT are to be formed.

Next, as shown in FIG. 4E, annealing is performed by radiating laser beams 230 so as to activate the doped impurities. For example, the XeCl excimer laser (wavelength: about 308 nm, pulse width: about 40 ns) can be used, and the laser beams are radiated with an energy density of about 250 mJ/cm$^2$. The radiation of the laser beam is repeated 20 times for each portion.

Next, as shown in FIG. 4F, a silicon oxide film having a thickness of about 600 nm is deposited as an interlayer insulating film 217 by a plasma CVD method. Alternatively, the interlayer insulating film 217 can be a silicon nitride film. The interlayer insulating film 217 can be formed by the method, for example, as described in Example 1.

Next, contact holes are formed through the interlayer insulating film 217. Electrodes/wirings 218 through 220 of TFTs, which are formed of metal materials, for example, of multi-layered films of titanium nitride and aluminum, are formed and connected to the source/drain regions 213 through 216. As the final step, then, annealing is performed in a hydrogen atmosphere of 1 atm at about 350° C. for about 30 minutes, thereby completing a CMOS structure having the n-type TFT and the p-type TFT.

In the thus formed n-type and p-type TFTs in Example 2, the base coat film 202 made of silicon oxide for preventing the diffusion of impurities from the substrate 201 is formed on the glass substrate 201, as can be seen in the cross-sectional view shown in FIG. 4F. In the crystalline silicon semiconductor film formed on the base coat film 202, the active region 203n of the n-type TFT including the source/drain regions 213 and 214 and the channel region 211, as well as the active region 203p of the p-type TFT including the source/drain regions 215 and 216 and the channel region 212, are formed. Furthermore, the gate insulating film 208 made of silicon oxide is formed thereon. On the gate insulating film 208, the gate electrodes 209 and 210 made of an aluminum film are formed so as to face the channel regions 211 and 212 of the n-type TFT and the p-type TFT, respectively. The interlayer insulating film 217 made of silicon oxide is formed so as to cover the gate electrodes 209 and 210. The electrodes/wirings 218 through 220 consisting of a two-layered film of metal materials, for example, titanium nitride and aluminum are formed, which are electrically connected to the source/drain regions 213 to 216 via the contact holes formed through the gate insulating film 208 and the interlayer insulating film 217.

The thus fabricated circuit having the CMOS structure exhibits good characteristics as follows.

Regarding the n-type TFT, a field-effect mobility is in the range of about 140 cm$^2$/Vs to about 180 cm$^2$/Vs, and a threshold voltage is in the range of about 1.5 V to about 2 V. Regarding the p-type TFT, a field-effect mobility is in the range of about 90 cm$^2$/Vs to about 120 cm$^2$/Vs, and a threshold voltage is in the range of about −3 V to about −4 V. A leak current in an OFF state of both n-type and p-type TFTs is small, i.e., about several pA. Furthermore, even when the above-mentioned characteristics are repeatedly measured, the results of measurement scarcely change with elapse of time and the operation characteristics are hardly degraded. Thus, extremely stable transistor characteristics can be obtained. As a result, a stable circuit having a CMOS structure with high reliability is obtained.

FIG. 3 is a top plane view showing the substrate on which n-type and p-type TFTs are formed according to Example 2, and illustrates the positional relationship between the n-type and p-type TFTs and the opening 200 provided for the mask. A cross-sectional view cut along the line 4-4' in FIG. 3 corresponds to the cross-sections shown in FIGS. 4A to 4F.

In Example 2 described above, the crystalline silicon semiconductor film 203b is obtained by lateral crystal growth from the region 203a which is crystallized by selectively introducing nickel through the opening 200. Inside the thus obtained crystalline silicon semiconductor film 203b, the n-type and p-type TFTs are formed. The source/drain regions 213 through 216 and the channel regions 211 and 212 of the n-type and p-type TFTs are placed with respect to the crystal growth direction indicated with the arrows 206 in such a manner as shown in FIG. 3. By this arrangement, since the moving direction of carriers and the crystal growth directions 206 are in parallel with each other, crystal grain boundaries do not exist against the moving direction of carriers. Thus, TFTs having a high mobility are realized.

Alternatively, the source/drain regions 213 through 216 and the channel region 211 and 212 may be placed so that the moving direction of carriers and the crystal growth directions 206 cross each other. In this case, carriers traverse a number of crystal grain boundaries upon moving, resulting in increase in the resistance between the source regions and the drain regions. Although the mobility is consequently lowered with the increase in the resistance, the trap density of the grain boundaries at the edges of the drain region which may degrade the characteristics during the TFT operation is reduced. Therefore, it is possible to fabricate TFTs having a large ON/OFF ratio.

The present invention is not limited to Examples 1 and 2 described above, and various other modifications can be made to the present invention.

For example, in Examples 1 and 2 described above, in order to introduce the catalyst elements for crystallization into the lower amorphous silicon semiconductor film, a method for allowing the surface of the lower amorphous silicon semiconductor film to be in contact with the solution in which nickel salt is dissolved so as to apply the solution onto the surface of the film (Example 1) or a method for forming the nickel thin film by vapor deposition is employed. A minute amount of nickel is introduced into the lower amorphous silicon semiconductor film according to any one of these methods to cause crystal growth. Alternatively, the following method can be used instead. Before depositing the lower amorphous silicon semiconductor film, a minute amount of nickel is introduced into the base coat film. Nickel is then diffused from the base coat film into the lower amorphous silicon semiconductor film through the bottom face of the lower amorphous silicon semiconductor film, thereby crystallizing the lower amorphous silicon semiconductor film. In order words, the introduction of the catalyst elements into the lower amorphous silicon semiconductor film and the crystal growth resulting therefrom can be conducted either from the upper face or the bottom face of the lower amorphous silicon semiconductor film.

Furthermore, other methods than those specifically described in the above examples can be used for introducing the catalyst elements.

For example, the catalyst elements can be diffused into the lower amorphous silicon semiconductor film from an SiO$_2$ film using a spin-on glass (SOG) material as a solvent for dissolving the catalyst elements in the form of nickel salt or the like. Alternatively, a method for forming a thin film containing the catalyst elements by sputtering or plating or a method for directly introducing the catalyst elements into the lower amorphous silicon semiconductor film by ion doping can be employed instead.

Furthermore, although nickel is used as the catalyst element for accelerating crystallization, cobalt, palladium, platinum, copper, silver, gold, indium, tin, aluminum or antimony can also be used. In either case where one of these elements is independently used or the case where the combination of a plurality of elements is used, the same effects as those described above can be obtained.

In Example 2, the crystallization of the crystalline silicon semiconductor film is improved by the irradiation of excimer laser beams serving as a pulse laser. More specifically, the crystalline silicon semiconductor film which has been crystallized utilizing the catalyst elements is heated through the irradiation of the excimer laser beams, so that a defect or dislocation within the grain boundaries in the crystalline silicon semiconductor film is effectively treated while keeping good crystallinity thereof. As a result, a crystalline silicon semiconductor film with high quality can be obtained.

As a heating method for improving crystallinity of the crystallized silicon semiconductor film, the same effects can be accomplished by using other laser beams such as a continuously oscillating Ar laser. Furthermore, instead of using laser beams, other techniques such as rapid thermal annealing (RTA) or rapid thermal processing (RTP) can be employed. In the RTA or RTP process, a workpiece is heated to a high temperature of about 1000° C. to about 1200° C. (a silicon monitor temperature) in a very short period of time using an infrared or flash lamp that provides an intense light equivalent in intensity to the laser beams.

In Example 1, the excimer laser irradiation or the above-mentioned other substitutive processes can be conducted.

Moreover, in the above examples, the semiconductor device solely including the n-type TFT is fabricated using the crystalline silicon semiconductor film obtained by utilizing the entire surface crystal growth of the amorphous silicon semiconductor film, as described in Example 1. On the other hand, the semiconductor device having a CMOS structure including the n-type and p-type TFTs is fabricated using the crystalline silicon semiconductor film obtained by utilizing the selective introduction of the catalyst elements into the amorphous silicon semiconductor film and subsequent lateral crystal growth, as described in Example 2. Alternatively, the semiconductor device having the CMOS structure including the n-type and p-type TFTs can be fabricated using the crystalline silicon semiconductor film obtained by utilizing the entire crystal growth of the amorphous silicon semiconductor film, which is described in Example 1, and the semiconductor device solely including either the n-type TFT or the p-type TFT can be fabricated using the crystalline silicon semiconductor film obtained by utilizing the selective introduction of the catalyst elements into the amorphous silicon semiconductor film and the subsequent lateral crystal growth, which is described in Example 2.

Besides the active-matrix substrate for a liquid-crystal display, the present invention can be applied in other applications as well, such as a close-contact type image sensor, a driver-monolithic thermal head, a driver-monolithic optical writing device or display device using organic electroluminescent (EL) elements as light-emitting elements, and a three-dimensional IC. By utilizing the present invention for these applications, high-performance characteristics of the semiconductor devices such as a fast response, a high resolution, etc., can be achieved.

Furthermore, the application of the present invention is not limited to the MOS-type transistors described in Examples 1 and 2. The present invention is also widely applicable to the fabrication process of a semiconductor device having other configurations such as a bipolar transistor or an electrostatic induction transistor.

As described above, according to the present invention, the operational characteristics of the semiconductor device are prevented from being adversely affected by the catalyst elements. Furthermore, by well treating the crystal grain boundaries, the semiconductor devices having high-performance element characteristics such as high mobility as well as a small leak current and high reliability can be obtained by a simplified fabrication process. Since the semiconductor devices excellent in uniformity of the device characteristics and stability can be obtained in the fabrication process, a percentage of non-defective devices (yield) is improved to result in reduction of the fabrication cost of the products.

In particular, when the method of the present invention is applied to the fabrication of a liquid-crystal display apparatus, improvement in both the switching characteristics of pixel switching TFTs required for an active-matrix substrate as well as improved performance and high integration required for TFTs constituting a peripheral driver circuitry can be achieved. As a result, a driver monolithic active-matrix substrate can be realized in which active matrix circuitry and peripheral driver circuitry are formed on the same substrate, leading to reduced module size, increased performance, and reduced cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device including an active region obtained by utilizing a silicon semiconductor film having crystallinity, comprising the steps of:

introducing a catalyst element for accelerating crystallization of a lower amorphous silicon semiconductor film into a predetermined region which is at least part of the lower amorphous silicon semiconductor film, then performing a first heat treatment so as to crystallize the lower amorphous silicon semiconductor film to form a lower crystalline silicon semiconductor film including a column-like crystal, subsequently forming an upper amorphous silicon semiconductor film on the lower crystalline silicon semiconductor film with no other film therebetween, and then performing a second heat treatment so as to crystallize the upper amorphous silicon semiconductor film to form an upper crystalline silicon semiconductor film, wherein a concentration of the catalyst element in the lower crystalline silicon semiconductor film is reduced by the second heat treatment so as to reform the lower crystalline silicon semiconductor film, the reformed lower crystalline silicon semiconductor film being used for forming the active region.

2. A method for fabricating a semiconductor device according to claim 1, further comprising the step of removing the upper crystalline silicon semiconductor film.

3. A method for fabricating a semiconductor device according to claim 1, wherein the catalyst element is selectively introduced into the predetermined region of the lower amorphous silicon semiconductor film so as to proceed crystallization of the lower amorphous silicon semiconductor film from the predetermined region toward a peripheral area thereof.

4. A method for fabricating a semiconductor device according to claim 1, wherein the catalyst element is introduced into an entire surface of the lower amorphous silicon semiconductor film.

5. A method for fabricating a semiconductor device according to claim 1, wherein a temperature of the second heat treatment is set at a temperature equal to or higher than that of the first heat treatment.

6. A method for fabricating a semiconductor device according to claim 1, wherein a temperature of the second heat treatment is set in the range of about 520° C. to about 600° C.

7. A method for fabricating a semiconductor device according to claim 1, wherein the catalyst element is at least one element selected from a group substantially consisting of nickel, cobalt, palladium, platinum, copper, silver, gold, indium, tin, aluminum and antimony.

8. A method for fabricating a semiconductor device including an active region obtained by utilizing a silicon semiconductor film having crystallinity, comprising the steps of:

forming a first amorphous silicon semiconductor film on a substrate;

introducing a catalyst element for accelerating crystallization of the first amorphous silicon semiconductor film into a predetermined region which is at least part of the first amorphous silicon semiconductor film;

performing a first heat treatment so as to crystallize the first amorphous silicon semiconductor film to form a first crystalline silicon semiconductor film;

forming a second amorphous silicon semiconductor film on the first crystalline silicon semiconductor film with no other film therebetween;

performing a second heat treatment so as to crystallize the second amorphous silicon semiconductor film to form a second crystalline silicon semiconductor film and simultaneously so as to reduce a concentration of the catalyst element in the first crystalline silicon semiconductor film to reform the first crystalline silicon semiconductor film; and forming the active region utilizing the reformed first crystalline silicon semiconductor film.

9. A method for fabricating a semiconductor device according to claim 8, further comprising the step of removing the second crystalline silicon semiconductor film.

10. A method for fabricating a semiconductor device according to claim 8, wherein the catalyst element is selectively introduced into the predetermined region of the first amorphous silicon semiconductor film so as to proceed crystallization of the first amorphous silicon semiconductor film from the predetermined region toward a peripheral area thereof.

11. method for fabricating a semiconductor device according to claim 8, wherein the catalyst element is introduced into an entire surface of the first amorphous silicon semiconductor film.

12. A method for fabricating a semiconductor device according to claim 8, wherein a temperature of the second heat treatment is set at a temperature equal to or higher than that of the first heat treatment.

13. A method for fabricating a semiconductor device according to claim 8, wherein a temperature of the second heat treatment is set in the range of about 520° C. to about 600° C.

14. A method for fabricating a semiconductor device according to claim 8, wherein the catalyst element is at least one element selected from a group substantially consisting of nickel, cobalt, palladium, platinum, copper, silver, gold, indium, tin, aluminum and antimony.

* * * * *